United States Patent
Shieh et al.

(10) Patent No.: US 9,187,659 B2
(45) Date of Patent: Nov. 17, 2015

(54) ETCH-RESISTANT COMPOSITION AND ITS APPLICATION

(75) Inventors: Pei-Rong Shieh, Kaohsiung (TW); Tsai-Fa Hsu, Kaohsiung (TW); Po-Cho Hsiao, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 0 days.

(21) Appl. No.: 13/569,228

(22) Filed: Aug. 8, 2012

(65) Prior Publication Data

US 2013/0230940 A1 Sep. 5, 2013

(30) Foreign Application Priority Data

Mar. 1, 2012 (TW) .............................. 101106700 A (51) Int. Cl.
  *C08K 5/34* (2006.01)
  *C08L 33/04* (2006.01)
  *C09D 11/106* (2014.01)
  *H01L 31/0224* (2006.01)
  *H01L 31/068* (2012.01)
  *H01L 31/18* (2006.01)

(52) U.S. Cl.
  CPC ...... *C09D 11/106* (2013.01); *H01L 31/022425* (2013.01); *H01L 31/068* (2013.01); *H01L 31/1804* (2013.01); *Y02E 10/547* (2013.01)

(58) Field of Classification Search
  CPC ..................... C09D 11/106; H01L 31/022425; H01L 31/068; H01L 31/1804
  USPC ........... 524/77, 104, 210, 425, 427, 445, 447, 524/492, 493, 507, 523, 529, 556, 560, 562
  See application file for complete search history.

(56) References Cited

U.S. PATENT DOCUMENTS

| 5,705,561 A * | 1/1998 | Kozakiewicz et al. ........ 524/730 |
| 7,105,588 B2 * | 9/2006 | Yang et al. ...................... 524/37 |
| 2004/0170917 A1 | 9/2004 | Takahashi |
| 2006/0141392 A1 | 6/2006 | Yoon et al. |

FOREIGN PATENT DOCUMENTS

| CN | 1518685 | 8/2004 |
| CN | 1782873 | 6/2006 |
| CN | 1909977 | 2/2007 |
| WO | 2005/072489 | 8/2005 |

* cited by examiner

*Primary Examiner* — Ling Choi
*Assistant Examiner* — Marie Reddick
(74) *Attorney, Agent, or Firm* — Grossman, Tucker, Perreault & Pfleger, PLLC (57) ABSTRACT

An etch-resistant composition is provided. The etch-resistant composition comprises a polymer and a first organic solvent. The polymer is prepared by copolymerizing a polymerization unit comprising styrene-based monomer(s) and acrylate-based monomer(s), and has a weight average molecular weight of at least about 35,000. Based on the total weight of the etch-resistant composition, the amount of the polymer is about 20.0 to about 60.0 wt % and the amount of the solvent is about 40.0 to about 80.0 wt %. The etch-resistant composition can be used for preparing a selective emitter of a solar cell.

10 Claims, 6 Drawing Sheets

ETCH-RESISTANT COMPOSITION AND ITS APPLICATION

This application claims priority to Taiwan Patent Application No. 101106700 filed on Mar. 1, 2012.

CROSS-REFERENCES TO RELATED APPLICATIONS

Not applicable.

BACKGROUND OF THE INVENTION

1. Field of the Invention

The present invention relates to an etch-resistant composition, and specifically, relates to an etch-resistant composition which is both acid-resistant and base-resistant. The etch-resistant composition can be applied in preparing a selective emitter of a solar cell.

2. Descriptions of the Related Art

Figure 1:
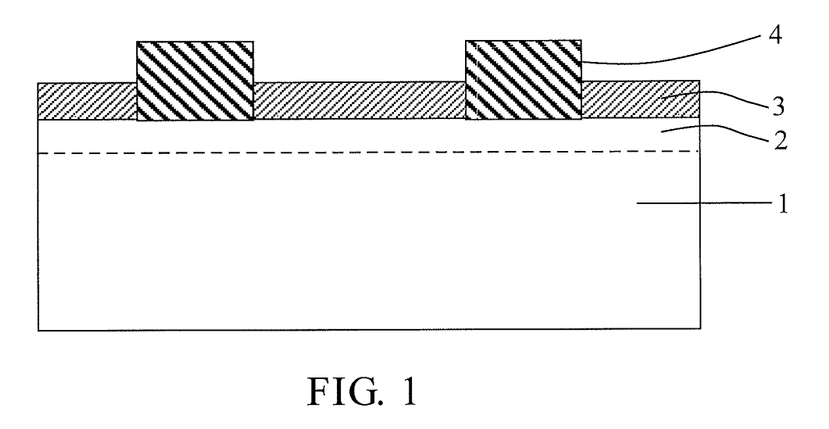
FIG. 1 is a diagram showing a conventional solar cell device.

Due to the increasingly serious environmental problems of energy shortages, greenhouse effect, etc., various countries are actively developing alternative energy sources, such as solar cells. FIG. 1 is a diagram of a typical solar cell, in which an n-type doping layer 2 is formed on a p-type silicon semiconductor substrate 1 through a doping process, and then an anti-reflective layer 3 (such as silicon nitride) and electrodes 4 are formed onto the n-type doping layer 2. Herein, the conductive types of the silicon semiconductor substrate 1 and the doping layer 2 can be interchanged. That is, the conductive types can also be a combination of an n-type silicon semiconductor substrate and a p-type doping layer.

It is well known that light absorbed by a solar cell is prone to be dissipated as heat or in forms of recombination of current carriers at high doping concentration, and thus, the photoelectric conversion efficiency is lowered. To reduce the above-mentioned cases, generally, doping layers with lower doping concentration and shallow depth are selected and used; however, these doping layers with lower doping concentration and shallow depth will face problems such as poor conduction. "Selective emitter" technique has been developed in the industry, which is characterized by forming a doping layer that is heavily doped underneath the electrode while forming a doping layer that is lightly doped in the light-affected area on which no electrode is set.

Figure 2:
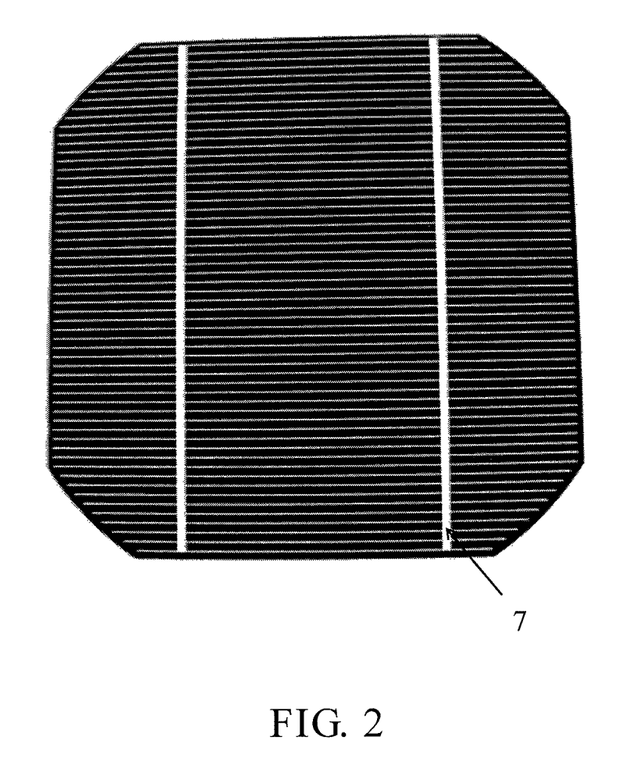
FIG. 2 is a diagram showing the pattern of an etch-resistant layer formed by printing.

Among several methods for manufacturing a selective emitter, an etch back method attracts much attention. In brief, the etch back method is described as follows: forming an etch-resistant layer 7 (mask) as shown in FIG. 2 at a predetermined electrode region (or non light-affected area) in a printing manner, and then performing etching to remove part of the doping layer in the unmasked region (i.e., the predetermined light-affected area) to thereby make the unmasked region a lightly doped one and the predetermined electrode region remain heavily doped. In this manner, the light that is absorbed by the solar cell is dissipated less as heat and less in forms of recombination of current carriers without damaging conductivity, and thus, photoelectric conversion efficiency is elevated. Herein, the known etch-resistant materials for forming an etch-resistant layer are usually either acid-resistant or base-resistant, and therefore, are unable to be used under various etching conditions (such as base etching or acid etching). As a result, an etch-resistant material which is both acid-resistant and base-resistant and is applicable under various etching conditions is in high demand in the industry.

In this regard, the present invention provides an etch-resistant composition which possesses excellent printing property and is resistant to acid as well as base, and the etch-resistant layer formed thereby can be removed simply by an organic solvent or a heat treatment. Thus, the etch-resistant composition of the present invention can be used under various etching processes (such as manufacturing a selective emitter of a solar cell) and the convenience is greatly increased.

SUMMARY OF THE INVENTION

The primary objective of this invention is to provide an etch-resistant composition comprising a polymer and a first organic solvent, wherein the polymer is obtainable by copolymerizing a polymerization unit comprising styrene-based monomer(s) and acrylate-based monomer(s) and has a weight average molecular weight of at least about 35,000. On the basis of the total weight of the etch-resistant composition, the amount of the polymer ranges from about 20.0 wt % to about 60.0 wt % and the amount of the first organic solvent ranges from about 40.0 wt % to about 80.0 wt %.

Another objective of this invention is to provide a method for manufacturing a selective emitter, comprising:
providing a substrate;
printing the above mentioned etch-resistant composition at a predetermined region of the substrate to form a predetermined pattern;
drying the printed etch-resistant composition to form an etch-resistant layer with the predetermined pattern on the substrate;
etching the unprinted region of the substrate;
removing the etch-resistant layer by a second organic solvent or a heat treatment; and forming an electrode.

The detailed technology and preferred embodiments implemented for the subject invention are described in the following paragraphs accompanying the appended drawings for people skilled in this field to well appreciate the features of the claimed invention. For the purpose of illustrating the principle of the present invention, the drawings are not necessarily drawn to scale.

DETAILED DESCRIPTION OF THE INVENTION

Unless otherwise stated herein, the terms "a (an)", "the" or the like used in this specification (especially in the Claims hereinafter) shall be understood to encompass both the singular form and the plural form.

The present invention provides an etch-resistant composition, which has good printability and acid/base resistant property. An etch-resistant layer formed by the composition can be simply removed by an organic solvent or a heat treatment. Thus, the etch-resistant composition of the present invention is applicable to various etching processes (such as manufacturing a selective emitter of a solar cell) and has wide applicability. In addition, when the etch-resistant composition of the present invention is applied in preparing a selective emitter, it can be easily dried while it provides excellent thermo-stability to the formed etch-resistant layer, which is not readily influenced by environmental temperature.

Specifically, the etch-resistant composition of the present invention comprises a polymer and a first organic solvent, wherein the polymer is obtainable by copolymerizing a polymerization unit comprising styrene-based monomer(s) and acrylate-based monomer(s).

Herein, the term "styrene-based monomer" refers to styrenes and its derivatives. Examples of a styrene-based monomer are selected from a group consisting of styrene, 4-chloro-α-methylstyrene, α-methylstyrene, 4-methylstyrene, α-ethylstyrene, 4-ethylstyrene, 3-methylstyrene, 4-propylstyrene, 4-cyclohexylstyrene, divinylbenzene, 3-methoxy-α-nitrostyrene, nitrostyrene, fluorostyrene, bromostryene, chlorostryene, chloromethylstyrene, aminostyrene, 4-methoxystyrene, 4-ethoxystyrene, hydroxystyrene, acetoxystyrene, 1-vinylnaphthalene, 2-vinylnaphthalene, 4-dodecylstyrene, 2-ethyl-4-benzylstryrene, 4-(phenylbutyl)styrene and combinations thereof. Preferably, a low-polar styrene-based monomer is used, and examples include: styrene, α-methylstyrene, 4-methylstyrene, α-ethylstyrene, 4-ethylstyrene, 3-methylstyrene, 4-propylstyrene, 4-dodecylstyrene, 4-methoxystyrene, 4-ethoxystyrene or combinations thereof. In an embodiment of the present invention, styrene is used as a styrene-based monomer.

Herein, the term "acrylate-based monomer" refers to acrylates and it derivatives. A low-polar acrylate-based monomer is preferably used, and examples include: methyl acrylate, methyl methacrylate, ethyl acrylate, ethyl methacrylate, butyl acrylate, butyl methacrylate, isobutyl acrylate, isobutyl methacrylate, 2-phenoxyethyl acrylate, 2-(2-ethoxyethoxy)ethyl acrylate, cyclic trimethylolpropane formal acrylate, isooctyl acrylate, isooctyl methacrylate, isodecyl acrylate, 2-ethylhexylacrylate, ethoxylated 1,6-hexanediol diacrylate, dipropylene glycol diacrylate, ethoxylated dipropylene glycol diacrylate, neopentyl glycol diacrylate, propoxylated neopentyl glycol diacrylate, 2-methyl-1,3-propylene glycol diacrylate, ethoxylated 2-methyl-1,3-propylene glycol diacrylate, 2-butyl-2-ethyl-1,3-propylene glycol diacrylate, ethylene glycol dimethacrylate, diethylene glycol dimethacrylate, tri(2-hydroxyethyl)isocyanurate triacrylate, propoxylated trimethylolpropane triacrylate, trimethylolpropane trimethacrylate, pentaerythritol tetraacrylate, ethoxylated pentaerythritol tetraacrylate, ditrimethylolpropane tetraacrylate, propoxylated pentaerythritol tetraacrylate, dipentaerythritol hexaacrylate, tripropylene glycol di(meth)acrylate, 1,4-butanediol di(meth)acrylate, 1,6-hexanediol di(meth)acrylate, ethoxylated trimethylolpropane tri(meth)acrylate, propoxylated glycerol tri(meth)acrylate, triethylene glycol dimethacrylate, trimethylolpropane tri(meth)acrylate, and combinations thereof. Herein, (meth)acrylate refers to methacrylate or acrylate. The acid value of the above low-polar acrylate-based monomer ranges from 0.1 to 2. Examples of a commercially available acrylate-based monomer include EM2108®, EM210®, EM211®, EM212®, EM224®, EM231®, EM265®, EM320®, EM328®, and EM39® of Eternal Chemical Co. In some embodiments of the present invention, alkyl(meth)acrylate is used as the acrylate-based monomer, such as methyl(meth)acrylate, ethyl(meth)acrylate, propyl(meth)acrylate, butyl(meth)acrylate, isobutyl(meth)acrylate, 2-ethylhexyl acrylate, isooctyl(meth)acrylate, and combinations thereof.

The polymer used in the etch-resistant composition of the present invention can be obtained through any appropriate method. For example, an acrylate-based monomer can first be polymerized to form acrylate-based oligomers, and then further copolymerized with a styrene-based monomer. The polymer can also be obtained by directly using acrylate-based oligomers to copolymerize with a styrene-based monomer. Examples of commercially available polymers include ETERAC 7109-X-50®, ETERAC 7106-X-50®, ETERAC 7107-X-50®, ETERAC 7612-1®, ETERAC 7121-M-50®, etc of Eternal Chemical Co.

The polymer in the etch-resistant composition of the present invention has a weight average molecular weight of at least about 35,000. If the molecular weight of the polymer is below 35,000, it fails to endow the etch-resistant composition with a sufficient etch-resistant property. In addition, when the etch-resistant composition is applied in preparing a selective emitter, it is an etch-resistant composition that is easily dried while it provides thermo-stability to the formed etch-resistant layer, which is not readily influenced by environmental temperature. Generally, the glass transition temperature (Tg) of the polymer is about 40° C. to about 120° C., and preferably, about 50° C. to about 110° C.

To endow the etch-resistant composition with different properties, the polymerization unit used in the polymer of the etch-resistant composition of the present invention, except the styrene-based monomer and acrylate-based monomer mentioned above, can optionally further comprise other resin monomers, such as epoxy resins, polyvinyl alcohol resins, polyethylene acetal resins, polyurethane, etc.

The first organic solvent in the etch-resistant composition of the present invention can be any inert solvent which can dissolve but not react with the polymer. Preferably, the first organic solvent has a high boiling point (above 100° C.), and examples include ester solvents, ether solvents, ether ester solvents, alcohol solvents, hydrocarbon solvents, etc., but not limited thereto. Specifically, the first organic solvent applicable for the present invention can be selected from a group consisting of toluene, 2,2,4-trimethyl-1,3-pentanediol monoisobutyrate (Texanol), 2,2,4-trimethyl-1,3-pentanediol diisobutyrate (TXIB), propylene glycol monomethyl ether acetate (PGMEA), methyl n-pentyl ketone (MAK), cyclohexanone, N-methylpyrrolidone (NMP), 1,3-cyclohexyldimethylamine (BAC), poly(maleic acid) (PMA), butyl carbitol acetate (BCA), diethylene glycol ethyl ether acetate, diethylene glycol, ethylene glycol butyl ether acetate, 2,4-dimethyl-3-pentanone, dimethyl glutarate, dimethyl succinate, dimethyl adipate, butyl acetate, terpineol, ethylene glycol phenyl ether, diethylene glycol monobutyl ether, dimethyl nylon acid, and combinations thereof, but not limited thereto. In some preferred embodiments of the present invention, the first organic solvent is selected from a group consisting of propylene glycol monomethyl ether acetate, toluene, butyl carbitol acetate, diethylene glycol ethyl ether acetate, terpineol, ethylene glycol phenyl ether, and combinations thereof.

The thixotropic index and viscosity of the etch-resistant composition of the present invention usually depend on the proportion of the organic solvent and polymer. Generally, the thixotropic index is suitably ranging from about 1.0 to about 2.5; viscosity is suitably ranging from about 2,000 cps to about 100,000 cps and preferably ranging from about 3,000 cps to about 80,000 cps. Adverse effects will occur if the thixotropic index or viscosity deviates from the above ranges. For example, if the thixotropic index or viscosity is too high, the etch-resistant composition will become too viscous, and a broken-line readily occurs while printing the composition on the surface to be treated to form circuits. On the other hand, if the thixoropic index or viscosity is too low, the formed circuits will easily deform, resulting in too much width increase in line width after drying (the preferred change in line width is about 20% to about 300%). In order to have the appropriate thixoropic index and viscosity in the etch-resistant composition of the present invention, on the basis of the total weight of the etch-resistant composition, the amount of the polymer preferably ranges from about 20.0 wt % to about 60.0 wt % and more preferably ranges from about 25.0 wt % to about 50.0 wt %. Likewise, the amount of the organic solvent range is from about 40.0 wt % to about 80.0 wt %, and preferably from about 40.0 wt % to about 60.0 wt %.

In addition, the etch-resistant composition with desired properties can also be obtained through adding other additives. For example, a thixoropic agent can be optionally added to adjust the thixoropic index and viscosity of the composition to a desired range. Thixoropic agents that can be used in the etch-resistant composition of the present invention include inorganic thixoropic agents (such as inorganic silicates, silica, organic bentonite, asbestos, kalinite, attapulgite, calcium carbonate, etc.), organic thixoropic agents (such as emulsified polyvinyl chloride, amide wax, polyethylene wax, castor oil derivatives, sorbitol, vegetable oil-based polymers, polyurethanes, etc.), metallic soaps, and combinations thereof, but are not limited thereto. Preferably, an organic thixoropic agent is used, and more preferably, an organic thixoropic agent selected from a group consisting of amide wax, polyethylene wax, castor oil derivatives, polyurethanes and combinations thereof is used. Examples of commercially available thixoropic agents applicable to the etch-resistant composition of the present invention include ADITIX R140®, AS-M110®, and ALBOTHIX 82-32® of SUPER-COLORI company; BYK-E410® and BYK-430® of BYK-Chemie company in Germany; THIXATROL ST®, THIXATROL MAX®, and M-P-A H105® of ELEMENTS company; and DISPARLON® 6700, DISPARLON NS-5210®, and DISPARLON NS-5510® of DISPARLON company, but are not limited thereto.

In general, poor printability of the etch-resistant composition because of high thixoropic index (should be less than 2.5) and viscosity due to adding too much thixotropic agent should be avoided. Thus, in the presence of a thixoropic agent, on the basis of the total weight of the etch-resistant composition, the amount of the thixoropic agent preferably ranges from about 0.1 wt % to about 5.0 wt %.

In another aspect, to enhance the adhesiveness between an etch-resistant layer made from the etch-resistant composition of the present invention and a substrate, and solve the problem of edge lateral erosion, an adhesion promoter can be optionally added in the etch-resistant composition. The adhesion promoter added is preferably an adhesion promoter with a molecular weight of less than about 100,000 and thermal cross-linking property, for example, silane coupling agents, phosphate esters, titanate esters, zirconate esters, chlorinated polyolefines, high molecular organic resins, or combinations thereof. Preferably, the adhesion promoter is silane coupling agents, phosphate esters, high molecular organic resins, or combinations thereof. More preferably, the adhesion promoter is silane coupling agents, high molecular organic resins, or combinations thereof. Herein, examples of silane coupling agents are aminosilane coupling agents, thiosilane coupling agents, vinylsilane coupling agents, epoxy silane coupling agents, or acrylate silane coupling agents. Examples of high molecular organic resins are organic resins with high hydroxyl groups and acid value of >20 (specific examples include ETERKYD 4908-B-70®, ETERKYD 4909®, and ETERKYD 49031-X-60® of Eternal company). Generally, excessive addition of an adhesion promoter to influence other properties of the etch-resistant composition should be avoided. Thus, in the presence of an adhesion promoter, on the basis of the total weight of the etch-resistant composition, the amount of the adhesion promoter preferably ranges from about 1.0 wt % to about 5.0 wt %.

Depending on application, the etch-resistant composition of the present invention can further comprise one or more aids commonly used in the art, such as a synergist, a sensitizer, a dispersing agent, a wetting agent, a thickening agent, a defoamer, and combinations thereof. The types of aids mentioned above are known to people with ordinary knowledge in the art, and people with ordinary knowledge in the art may refer to the disclosure of the present invention to select a suitable type and amount of the aids based on their common knowledge.

The etch-resistant composition of the present invention is applicable for manufacturing a selective emitter, especially for manufacturing a selective emitter of a silicon crystal solar cell, and has an excellent printability and acid/base resistant property. The etch-resistant layer formed by the composition of the present invention can be easily removed via an organic solvent or a heat treatment (such as sintering at a high temperature).

The present invention further provides a method for manufacturing a selective emitter, comprising:
(a) providing a substrate;
(b) printing the etch-resistant composition described above at a predetermined region of the substrate to form a predetermined pattern;
(c) drying the printed etch-resistant composition to form an etch-resistant layer with the predetermined pattern on the substrate;
(d) etching the unprinted region of the substrate;
(e) removing the etch-resistant layer by a second organic solvent or a heat treatment; and
(f) forming an electrode.

Specifically, the etch-resistant composition of the present invention can form a pattern on any substrate to be etched, such as a semiconductor substrate (such as a single crystal silicon wafer, a polycrystalline silicon wafer, a silicon film, a amorphous silicon, etc.), an organic substrate, an inorganic compound semiconductor substrate (such as a semiconductor substrate made of an inorganic compound of Group III-V, Group II-VI, or Group I-III-VI), a glass substrate, a metal substrate, etc. For example, the semiconductor substrate is a p-type silicon semiconductor substrate with an n-type doping layer, or an n-type silicon semiconductor substrate with a p-type doping layer.

The printing mentioned in the above step (c) is not particularly limited, and it can be any printing method known to people with ordinary knowledge in the art, such as screen printing, coating, spray, dipping, etc. Screen printing or spray is preferred. In some preferred embodiments of the present invention, the screen printing method is used to print the etch-resistant composition on at least one surface of a substrate to form a predetermined pattern (with a film thickness ranging from about 10 μm to about 40 μm) through a screen printing machine (with a screen board ranging from about 180 mesh to about 400 mesh).

After the formation of a predetermined pattern, the first organic solvent in the composition is removed by a drying method, and the components left thus form an etch-resistant layer with a predetermined pattern. The drying method used herein is not particularly limited as long as it volatilizes the organic solvent. Examples include air drying, heating drying, radial drying, etc.

After the formation of an etch-resistant layer, etching is performed using a suitable acid etching solution or base etching solution according to the substrate materials. The etch-resistant composition of the present invention is resistant to both acid and base, and thus it is applicable under both acid etching and base etching processes.

The etch-resistant composition of the present invention will not undergo cross-linking while forming the etch-resistant layer; therefore after the etching is completed, the etch-resistant layer can simply be removed by a second organic solvent or a heat treatment to obtain a predetermined etching structure. The second organic solvent used herein can be the same or different from the first organic solvent in the etch-resistant composition described above. Preferably, the second organic solvent is a high polar organic solvent, such as ethanol, propylene glycol monomethyl ether acetate (PGMEA), isopropyl alcohol (IPA), dimethyl sulfoxide (DMSO), N,N-dimethylacetamide (DMAC), acetone, or mixtures thereof, but not limited thereto. The heat treatment mentioned above directly burns out the etch-resistant layer at high temperature to remove the etch-resistant layer while passivating the substrate surface. The time and temperature for a heat treatment are not particularly limited as long as the etch-resistant layer can be completely removed without damaging the substrate. Generally, the temperature of a heat treatment ranges from about 300° C. to about 1000° C., and the time for heat treatment ranges from about 10 seconds to about 600 seconds, but is not limited thereto. In the method of the present invention, whether the etch-resistant layer has been completely removed or not can be determined by measuring the electrical resistance value, i.e., the etch-resistant layer has been completely removed when the measured electrical resistance value of the region underneath the etch-resistant layer is the same as the original electrical resistance value of the substrate. In some embodiments of the present invention, a heat treatment is conducted in a range from about 400° C. to about 800° C. for about 15 seconds to about 150 seconds.

Figure 3A:
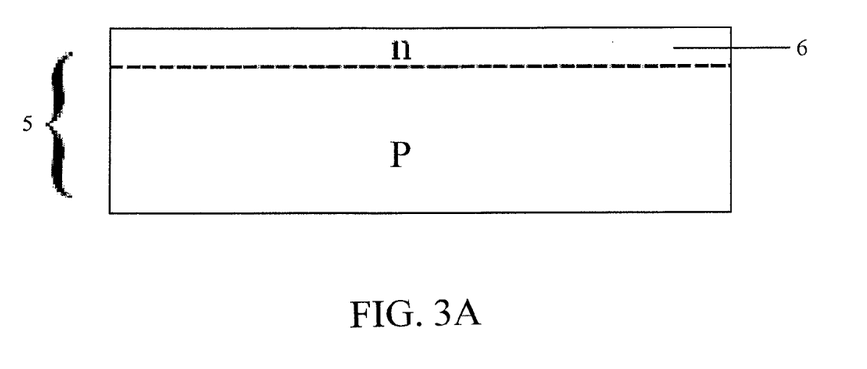
FIG. 3A is a diagram showing a substrate coated with a doping layer.
Figure 3B:
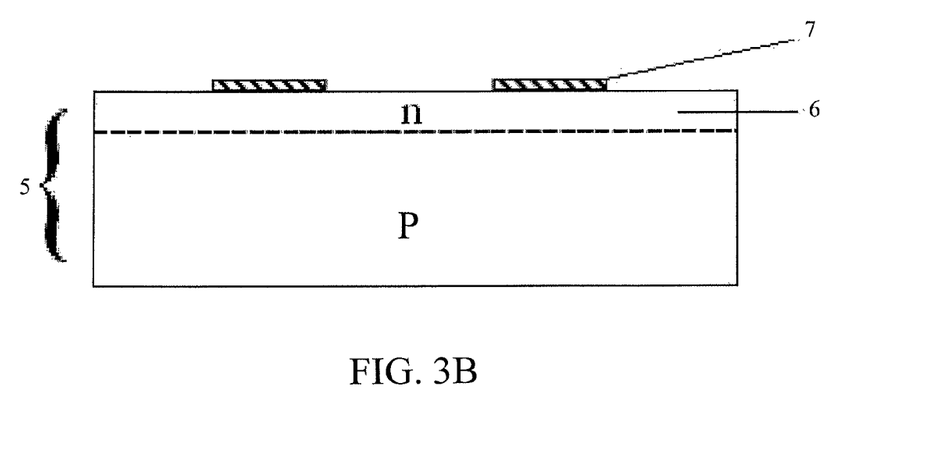
FIG. 3B is a diagram showing a substrate with an etch-resistant layer prior to etching.
Figure 3C:
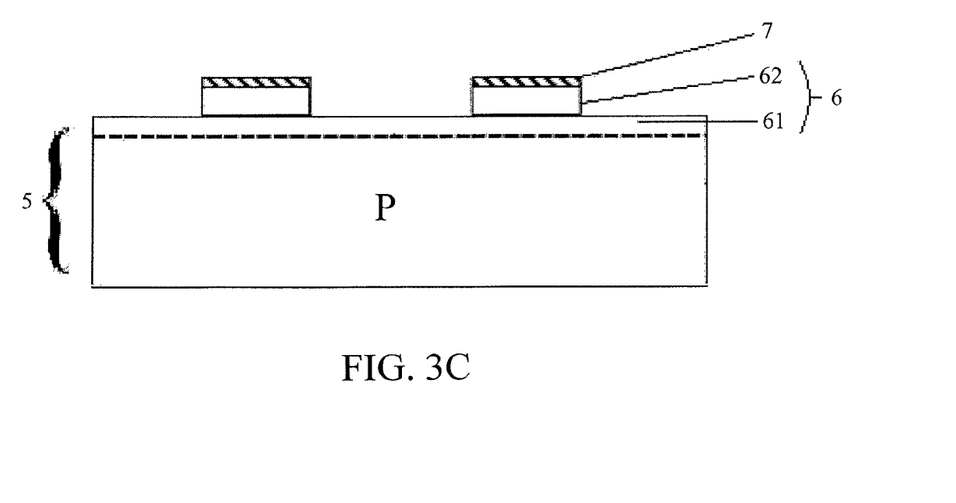
FIG. 3C is a diagram showing a substrate on which the etch-resistant layer has not been removed after etching.
Figure 3D:
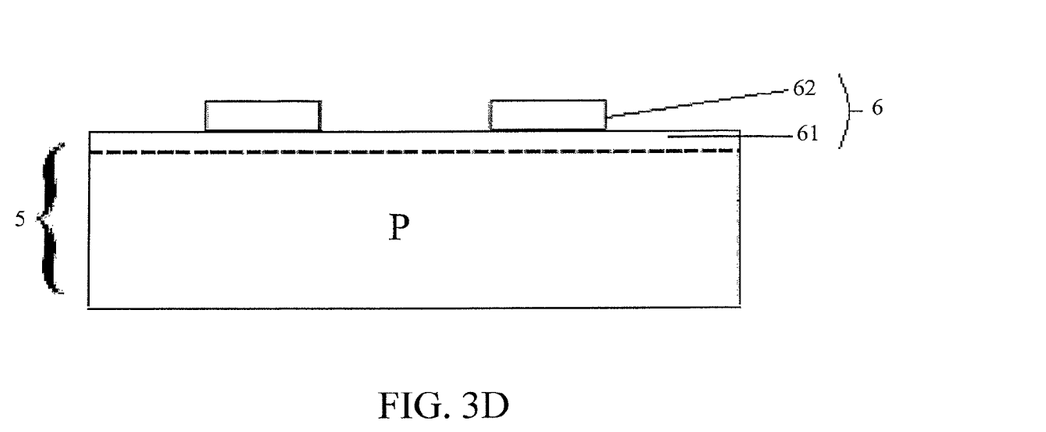
FIG. 3D is a diagram showing a substrate on which the etch-resistant layer has been removed after etching.
Figure 3E:
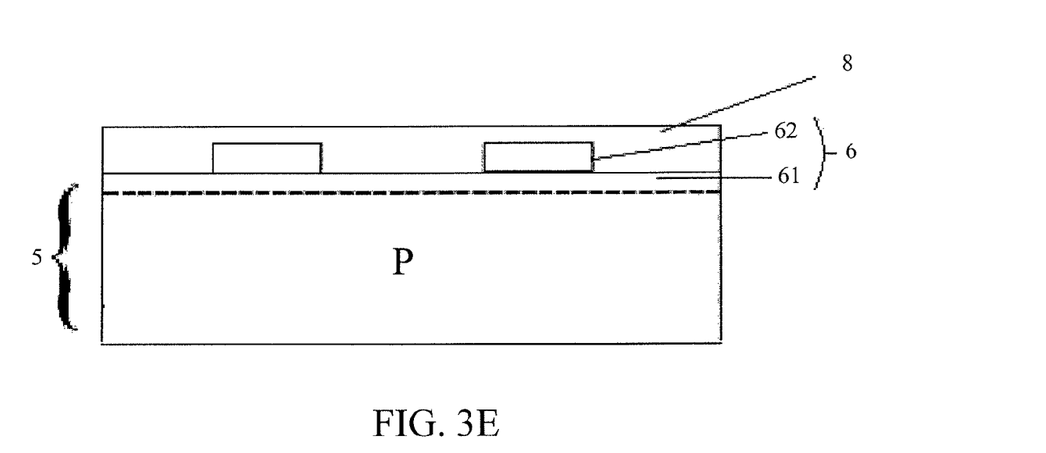
FIG. 3E is a diagram showing a substrate on which an anti-reflective layer has been formed after removal of the etch-resistant layer.
Figure 3F:
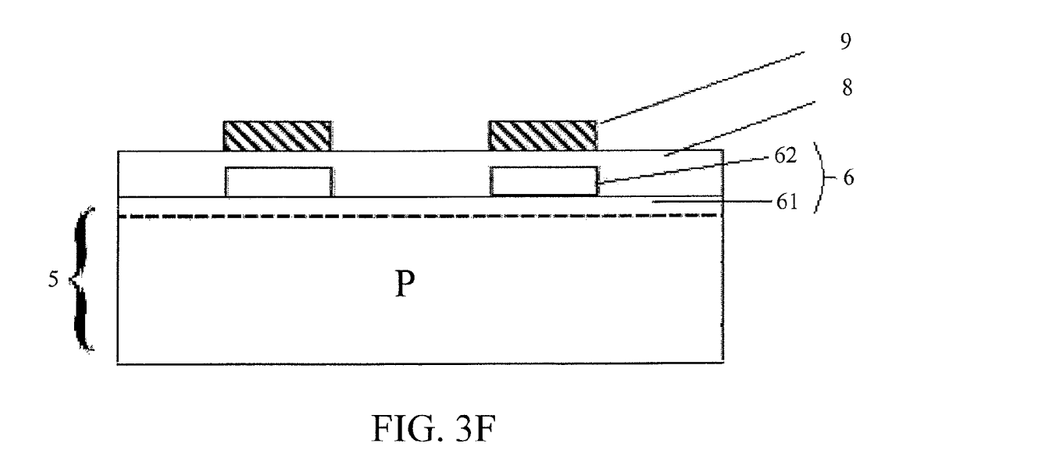
FIG. 3F is a diagram showing a substrate after formation of an electrode pattern layer.
Figure 3G:
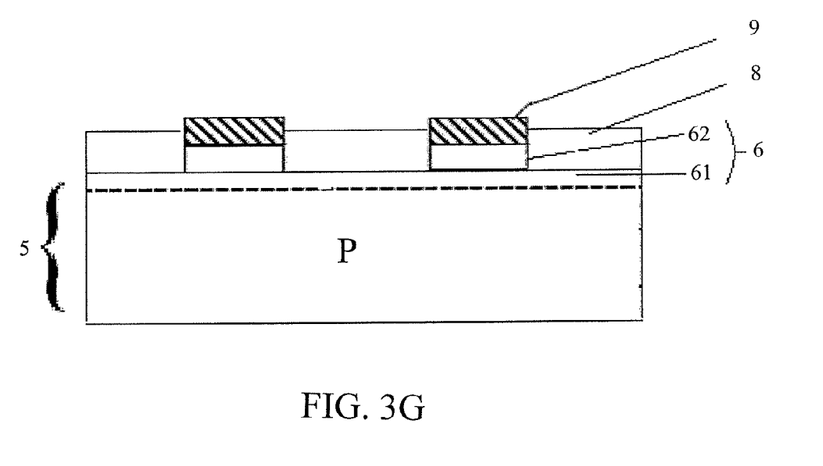
FIG. 3G is a diagram showing a substrate on which a selective emitter is formed through sintering.

An exemplary embodiment of the present invention for manufacturing a selective emitter is described in the following paragraphs accompanying FIG. 3A to FIG. 3G. The embodiment is for exemplified purpose only and the scope of the present invention is not limited thereby. The method comprises:

providing a substrate 5, which is a p-type silicon semiconductor substrate with an n-type doping layer 6 thereon, as shown in FIG. 3A;

applying the etch-resistant composition of the present invention on the substrate 5 by printing (such as screen printing or spraying) to form a predetermined pattern, followed by drying it to form an etch-resistant layer 7, as shown in FIG. 3B;

etching the unprinted region (i.e., regions unprotected by the etch-resistant layer 7) of the substrate 5 to form a low concentration doping layer 61 and a high concentration doping layer 62, as shown in FIG. 3C;

removing the etch-resistant layer 7 by a high polar organic solvent (such as propylene glycol monomethyl ether acetate) to complete a predetermined etching structure, as shown in FIG. 3D;

forming an anti-reflective layer 8 on the surface of the substrate 5 after completion of the etching structure, as shown in FIG. 3E;

applying a conductive silver paste 9 on the anti-reflective layer 8 by printing, wherein the line width of the conductive silver paste 9 is not wider than that of the etch-resistant layer 7, as shown in FIG. 3F; and performing a sintering step to diffuse the conductive components of the conductive silver paste 9 to the high concentration doping layer 62, as shown in FIG. 3G, and the manufacturing of a selective emitter is completed.

Hereinafter, the present invention will be further illustrated with reference to the following exemplary embodiments, wherein the instruments and analysis methods are described as follows. However, these embodiments are only provided for illustration purposes, but not to limit the scope of the present invention.

[Thixotropic Index and Viscosity Tests]

According to the ASTM D4287-94 standard method, the thixotropic index and viscosity of etch-resistant compositions are measured under 5 rpm at 25° C. using Brookfield viscometer model HB with cone spindles CP51.

[Printability/Etch-Resistance Tests]

Each etch-resistant composition is continuously printed to a silicon wafer substrate through a screen printing machine to form line patterns with a thickness ranging from about 40 μm, and dried at 150° C. for 10 minutes to form an etch-resistant pattern layer. Subsequently, the substrate is etched at room temperature using an acid etching solution (5 wt % hydrofluoric acid aqueous solution) and at 50° C. using a base etching solution (5 w % potassium hydroxide aqueous solution), respectively, both for 40 seconds. The processability of each etch-resistant composition during printing and acid/base resistant property of the etch-resistant pattern layer are observed and classified as follows.

<Determination of Printability>
◎ Printing proceeds continuously and pattern is complete during printing
● Printing proceeds continuously but with occasionally occurred incomplete pattern
× Printing does not proceed continuously or the printed patterns are incomplete <Determination of Etch-Resistance>
● The integrity of an etch-resistant pattern layer is maintained in an acid etching solution/base etching solution
× An etch-resistant pattern layer is partially eroded or peeling off in an acid etching solution/base etching solution

EXAMPLES

[A. Preparation of Etch-Resistant Compositions]

Example 1

Etch-resistant composition 1 is prepared by mixing the components in a proportion as follows: about 44.0 wt % polymer (ETERAC 7612-1) and about 56.0 wt % organic solvent (a mixture of butyl carbitol acetate and toluene in a ratio of 5:4). Herein, the molecular weight of the polymer is about 57,247.

Example 2

Etch-resistant composition 2 is prepared by mixing the components in a proportion as follows: about 44.0 wt % polymer (ETERAC 7612-1), about 54.5 wt % organic solvent (a mixture of butyl carbitol acetate and toluene in a ratio of 5:4), about 1.0 wt % adhesion promoter (ETERKYD 49031-X-60), and about 0.5 wt % thixotropic agent (ADITIXR140). Herein, the molecular weight of the polymer is about 57,247.

Example 3

Etch-resistant composition 3 is prepared by the same method as Example 2, except that the amount of the polymer and organic solvent used are altered to be about 40.0 wt % and about 58.5 wt %, respectively.

Example 4

Etch-resistant composition 4 is prepared by the same method as Example 2, except that the molecular weight of the polymer (ETERAC 7612-1) is adjusted to be about 37,241.

Example 5

Etch-resistant composition 5 is prepared by the same method as Example 2, except that the amount of the thixotropic agent and organic solvent used are altered to be about 3.6 wt % and about 51.4 wt %, respectively.

Example 6

Etch-resistant composition 6 is prepared by the same method as Example 2, except that the amount of the thixotropic agent and organic solvent used are altered to be about 5.0 wt % and about 50.0 wt %, respectively.

Example 7

Etch-resistant composition 7 is prepared by the same method as Example 2, except that DISPARLON 6700 is used as the thixotropic agent and the amount of which is maintained at about 0.5 wt %.

Example 8

Etch-resistant composition 8 is prepared by the same method as Example 2, except that DISPARLON 6700 is used as the thixotropic agent and the amount of the thixotropic agent and organic solvent used are altered to be about 3.6 wt % and about 51.4 wt %, respectively.

Example 9

Etch-resistant composition 9 is prepared by the same method as Example 2, except that the first organic solvent is a mixture of ethylene glycol phenyl ether and terpineol in a ratio of 1:1.

Example 10

Etch-resistant composition 10 is prepared by the same method as Example 2, except that the first organic solvent is a mixture of propylene glycol monomethylether acetate, 1,3-cyclohexanedimethanamine, terpineol, and diethylene glycol ether acetate in a ratio of 3:1:3:3.

Example 11

Etch-resistant composition 11 is prepared by the same method as Example 2, except that the polymer is ETERAC 7121-M-50 resin (the molecular weight is about 37,000).

Comparative Example 1

Etch-resistant composition 1' is prepared by the same method as Example 2, except that the amount of the polymer and organic solvent used are altered to be about 19.0 wt % and about 79.5 wt %, respectively.

Comparative Example 2

Etch-resistant composition 2' is prepared by the same method as Example 2, except that the amount of the polymer and organic solvent used are altered to be about 61.0 wt % and about 37.5 wt %, respectively.

Comparative Example 3

Etch-resistant composition 3' is prepared by the same method as Example 2, except that the molecular weight of the polymer (ETERAC 7612-1) is adjusted to be about 11,932.

Comparative Example 4

Etch-resistant composition 4' is prepared by the same method as Example 2, except that the amount of the thixotropic agent and organic solvent used are altered to be about 5.5 wt % and about 49.5 wt %, respectively.

Comparative Example 5

Etch-resistant composition 5' is prepared by the same method as Example 2, except that the polymer is polyvinyl acetal resin (KURARAY B75H) and the amount of which is maintained at about 44.0 wt %.

Comparative Example 6

Etch-resistant composition 6' is prepared by the same method as Example 2, except that the organic solvent is isopropyl alcohol (IPA).

[B. Analysis of Molecular Weight and Polymer Composition]

The printability, and etch-resistant property of etch-resistant compositions 1, 2, 3, 4, 1', 2', and 3' are tested and the results are shown in Table 1.

TABLE 1

| Etch-resistant composition No. | 1 | 2 | 3 | 4 | 1' | 2' | 3' |
|---|---|---|---|---|---|---|---|
| polymer (wt %) | 44 | 44 | 40 | 44 | 19 | 61 | 44 |
| adhesion promoters (wt %) | 0 | 1 | 1 | 1 | 1 | 1 | 1 |
| thixotropic agent (wt %) | 0 | 0.5 | 0.5 | 0.5 | 0.5 | 0.5 | 0.5 |
| organic solvent (wt %) | 56 | 54.5 | 58.5 | 54.5 | 79.5 | 37.5 | 54.5 |
| printability | ◎ | ◎ | ◎ | ◎ | X | X | ◎ |
| acid resistance | ● | ● | ● | ● | X | X | X |
| base resistance | ● | ● | ● | ● | X | X | X |
| polymer molecular weight | 57,247 | 57,247 | 57,247 | 37,241 | 57,247 | 57,247 | 11,932 |

As shown in Table 1, the etch-resistant compositions of the present invention provide good printability and acid/base resistant property either with adding (etch-resistant compositions 2 to 4) or without adding (etch-resistant composition 1) an adhesion promoter and a thixotropic agent. In the etch-resistant composition 1', the polymer content is too low (lower than 20 wt %) to effectively shield and protect the predetermined etch-resistant region. On the contrary, in the etch-resistant composition 2', the polymer content is too high (higher than 60 wt %), causing poor fluidity and making the ink retreat from fountain roller. As a result, the predetermined etch-resistant region cannot be uniformly and completely covered, and thus, the substrate underneath cannot be fully protected neither. As for the etch-resistant composition 3' using a polymer with lower molecular weight (lower than 35,000), it has good printability but the polymer used has poor acid/base resistant property, and thus, the etch-resistant composition 3' cannot effectively protect the predetermined etch-resistant region.

Figure 4:
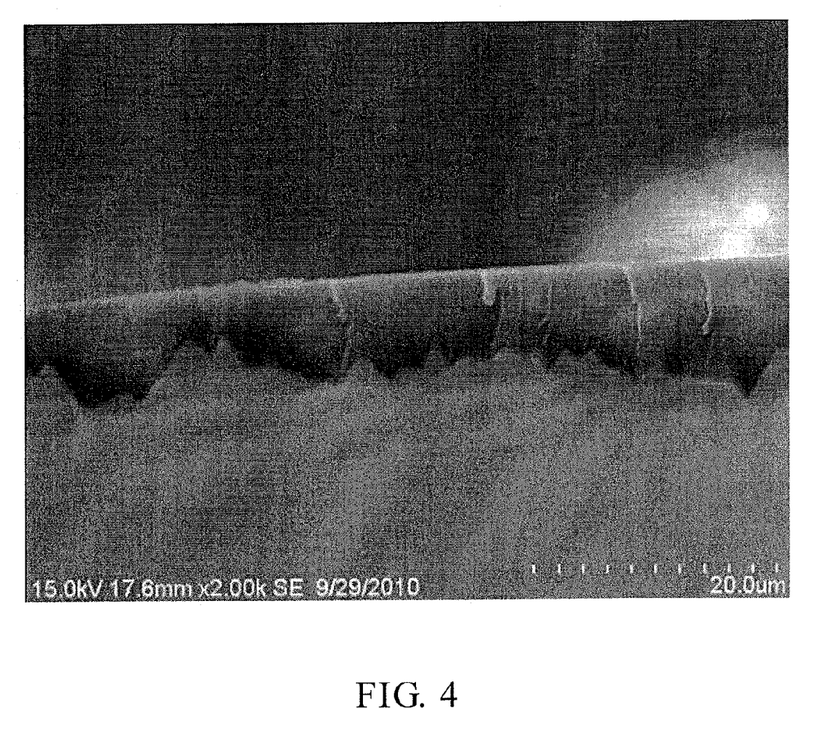
FIG. 4 is an SEM image showing a substrate after acid etching, wherein the substrate is covered with an etch-resistant pattern formed by the etch-resistant composition of the present invention.
Figure 5:
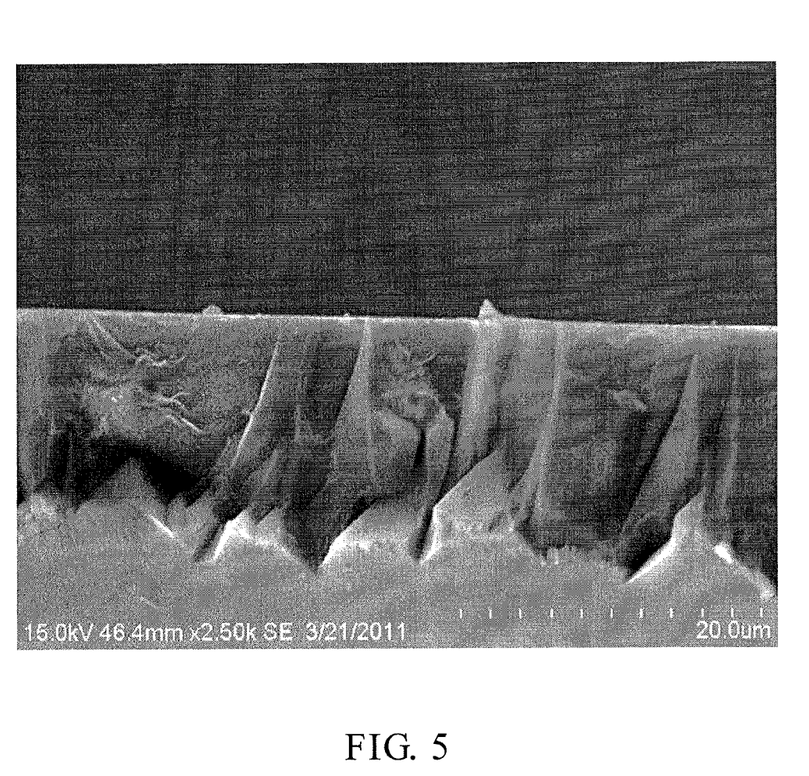
FIG. 5 is an SEM image of showing substrate after base etching, wherein the substrate is covered with an etch-resistant pattern formed by the etch-resistant composition of the present invention.

In addition, FIGS. 4 and 5 are Scanning Electron Microscope (SEM) images showing substrates with etch-resistant layers formed by drying etch-resistant composition 2 on the surfaces thereof and undergoing etching reaction in an acid etching solution and a base etching solution. One can easily observe that the etch-resistant layer and substrate are well adhered to each other, and the substrate covered underneath the etch-resistant layer can be fully protected under both acid etching and base etching conditions.

[C. Analysis of Thixotropic Index and Polymer Types]

The thixotropic index, viscosity, printability, and etch-resistant properties of etch-resistant compositions 2, 5, 6, 7, 8, 9, 10, 11, 4', 5' and 6' are tested and the results are shown in Table 2.

TABLE 2

| Etch-resistant composition No. | viscosity (cp) | thixotropic index | printability | acid resistance | base resistance |
|---|---|---|---|---|---|
| 2 | 4500 | 1.03 | ◎ | ● | ● |
| 5 | 15741 | 1.59 | ◎ | ● | ● |
| 6 | 22507 | 1.19 | ◎ | ● | ● |
| 7 | 5523 | 1.13 | ◎ | ● | ● |
| 8 | 11668 | 1.14 | ◎ | ● | ● |
| 9 | 12427 | 1.13 | ◎ | ● | ● |
| 10 | 15741 | 1.15 | ◎ | ● | ● |
| 11 | 3831 | 1.00 | ◎ | ● | ● |
| 4' | 13049 | 2.63 | ● | ● | X |
| 5' | 9044 | 2.14 | X | X | X |
| 6' | 2831 | 1.02 | X | ● | ● |

As can be seen from Table 2, the etch-resistant compositions 2, 5, 6, 7, and 8 using different types and amount of the thixotropic agents can all fulfill the printability and acid/base resistant property desired in the present invention; therefore, the type of thixotropic agents used in the present invention is not particularly limited. However, too much thixotropic agent (greater than 5.0 wt %) is used in etch-resistant composition 4', leading to an excessively high thixotropic index (higher than 2.5), which results in insufficient fluidity of etch-resistant composition 4', raising the problems of narrow linear shape, incomplete linear shape, and even broken lines during printing, and thus, etch-resistant composition 4' is unable to effectively protect the predetermined etch-resistant region. Moreover, a narrow linear shape may cause perforation erosion because of lateral erosion, and further cause short circuiting to the device produced afterwards. In addition, an excessive thixotropic agent also influences the acid/base resistant property of an etch-resistant composition. The etch-resistant composition 4' is inferior to the etch-resistant composition 1 in terms of base resistant property. As a result, the amount of a thixotropic agent used should be in a range of 0.1 wt % to 5.0 wt % to provide good printability and acid/base resistance.

In addition, the results of etch-resistant compositions 2 and 11 show that in the cases in which the polymerization unit of the polymer comprises a styrene-based monomer and an acrylate-based monomer, the compositions provide good printability and acid/base resistant property. Therefore, the polymer in the etch-resistant composition of the present invention is not particularly limited, and a suitable polymer containing a styrene-based monomer and an acrylate-based monomer can be used according to the actual need.

Compared to the etch-resistant composition 2, even though the etch-resistant composition 5' uses polyvinyl acetal resin with properties of solvent and wear tolerance, it does not comprise a styrene-based monomer and an acrylate-based monomer in the polymerization unit of the polymer it, and thus, the etch-resistant composition 5' has poor printability and acid/base resistant property.

Moreover, from comparing the results of the etch-resistant compositions 2, 9 and 10 with the etch-resistant composition 6', when a first organic solvent with a high boiling point (>100° C.) is used, the etch-resistant composition exhibits good printability and etch-resistant property while it exhibits poor printability (because ink leakage occurs prior to screen printing) when IPA with low boiling point (about 83° C.) is used as the first organic solvent.

[D. Preparation of a Selective Emitter of a Solar Cell-Solvent Removal Method]

Selective emitter 1: Etch-resistant composition 1 is printed on an n-type semiconductor substrate with a p-type doping layer with electrical resistance of 60 Ω/sq at the surface region through screen printing to form line patterns with a thickness of about 40 μm, and then dried at 150° C. for 10 minutes to form an etch-resistant pattern layer. Subsequently, etching is performed to the substrate at room temperature using an acid etching solution (5 wt % hydrofluoric acid aqueous solution) until the electrical resistance value of the region uncoated with the etch-resistant composition reaches 65 Ω/sq. Then, the etch-resistant composition is removed by propylene glycol monomethyl ether acetate. Finally, the preparation of the selective emitter 1 is completed by forming electrodes at the regions without being etched.

Selective emitter 2: The above method is repeated to prepare a selective emitter 2, except that the acid etching is performed until the electrical resistance value of the region uncoated with the etch-resistant composition reaches 80 Ω/sq.

Comparative emitter 1': An n-type semiconductor substrate with a p-type doping layer and an electrical resistance of 60 Ω/sq at the surface region is used. An electrode with the same pattern as the selective emitter 1 is formed on the substrate to complete the preparation of comparative emitter 1'.

Figure 6:
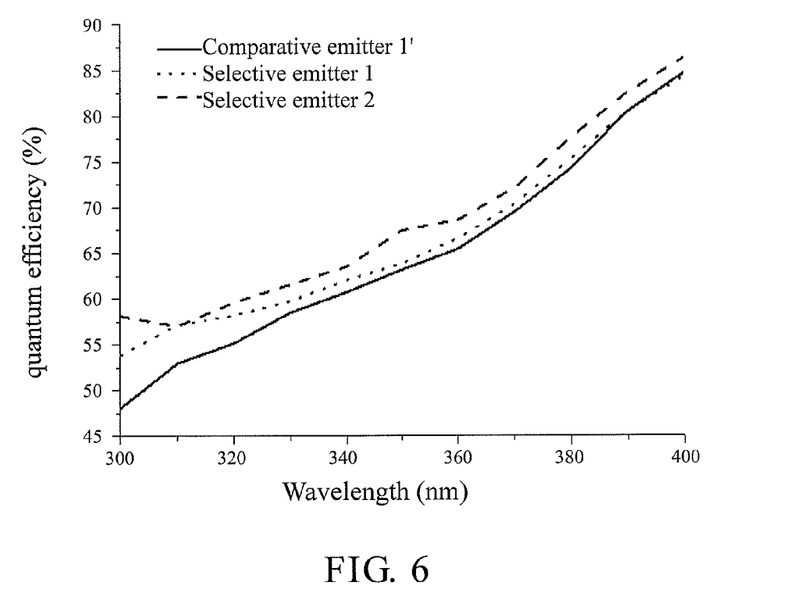
FIG. 6 is a diagram showing the internal quantum efficiency of a solar cell device with selective emitters 1 and 2 and comparative emitter 1', respectively.

FIG. 6 is a diagram showing the internal quantum efficiency of a solar cell device with comparative emitter 1', selective emitter 1 and selective emitter 2, respectively. According to FIG. 6, the use of a selective emitter provides good quantum efficiency, and by increasing the differences of surface electrical resistance values between an electrode area and an area not covered with electrodes (i.e., a region that is not covered with an etch-resistant composition during etching), that is, the differences in doping concentration are increased between the region with electrodes and the region without electrodes (for example, for selective emitter 1, the electrical resistance value rose from 60 Ω/sq to 65 Ω/sq; for selective emitter 2, the electrical resistance value rose from 60 Ω/sq to 80 Ω/sq), the absorption of the solar cell device at a short wavelength (around 350 nm) can further be improved. Meanwhile the photocurrent density of the device is enhanced, which in turn promotes quantum efficiency of the solar cell device.

[E. Preparation of a Selective Emitter of a Solar Cell—Heat Treatment]

Selective emitter 3: The etch-resistant composition 1 is printed on an n-type semiconductor substrate with a p-type doping layer and an electrical resistance of 60 Ω/sq at the surface region through a screen printing machine to form line patterns with a thickness of about 40 μm, and then dried at 150° C. for 10 minutes to form an etch-resistant pattern layer. Subsequently, etching is performed to the substrate at room temperature using an acid etching solution (5 wt % hydrofluoric acid aqueous solution) until the electrical resistance value of the region uncoated with the etch-resistant composition reaches 65 Ω/sq. Then, the etch-resistant glue is removed by a heat treatment at top temperature of 744° C. for 60 seconds (about 3 seconds at temperature above 700° C.) using a heat treatment machine (Despatch). Finally, the preparation of the selective emitter 3 is completed by forming electrodes at the regions without being etched.

Selective emitter 4: The above method is repeated to prepare a selective emitter 4, except that acid etching is performed until the electrical resistance value of the region uncoated with the etch-resistant composition reaches 80 Ω/sq.

Figure 7:
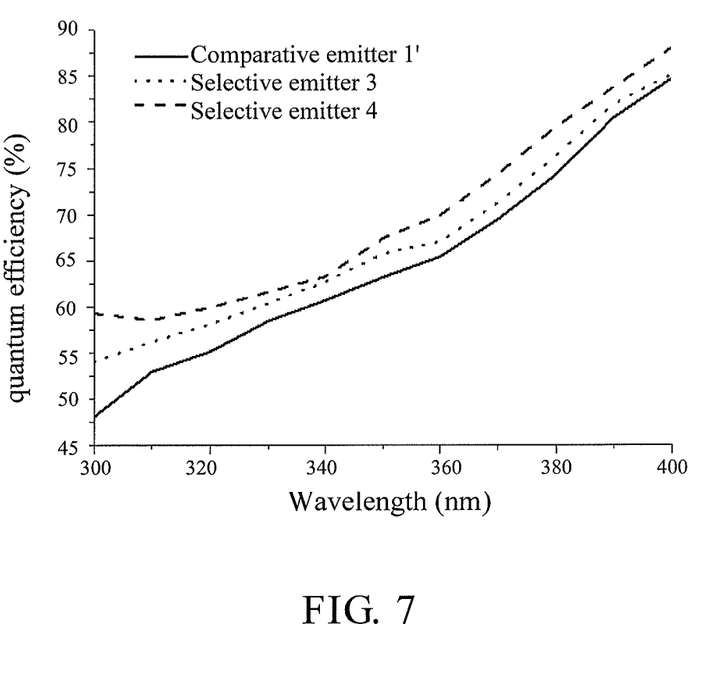
FIG. 7 is a diagram showing internal quantum efficiency of a solar cell device with selective emitters 3 and 4 and comparative emitter 1', respectively.

FIG. 7 is a diagram showing the internal quantum efficiency of a solar cell device with comparative emitter 1', selective emitter 3 and selective emitter 4, respectively. According to FIG. 7, the use of a selective emitter provides good quantum efficiency, and through increasing the differences of surface electrical resistance values between an electrode area and an area not covered with electrodes (i.e., a region that is not covered with an etch-resistant composition during etching), that is, increasing the differences in doping concentration between the region with electrodes and the region without electrodes (for example, selective emitter 3 rose from 60 Ω/sq to 65 Ω/sq; selective emitter 4 rose from 60 Ω/sq to 80 Ω/sq), the absorption of a solar cell device at a short wavelength (around 350 nm) can further be improved. Meanwhile, the photocurrent density of the device is enhanced, which in turn promotes quantum efficiency of the solar cell device.

Given the above, the etch-resistant composition of the present invention can be successfully applied in the preparation of a selective emitter to provide a solar cell device with good quantum efficiency. During the preparation of a selective emitter, the etch-resistant composition of the present invention can be removed simply by a solvent or a heat treatment after being dried, and this is very convenient in terms of processing.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

BRIEF DESCRIPTION OF REFERENCE NUMERALS

1, 5 silicon wafer substrate
2, 6 doping layer
3, 8 anti-reflective layer
4, 9 electrode
61 low concentration doping layer
62 high concentration doping layer
7 etch-resistant layer

What is claimed is:

1. An etch-resistant composition comprising a polymer and a first organic solvent, wherein the polymer is formed from polymerization units consisting of styrene-based monomer(s) and (meth)acrylate-based monomer(s) and has a weight average molecular weight of at least about 35,000, wherein on the basis of the total weight of the etch-resistant composition, the amount of the polymer is about 20.0 wt. % to about 60.0 wt. % and the amount of the first organic solvent is about 40.0 wt. % to about 80.0 wt. %.

2. The etch-resistant composition of claim 1, wherein the styrene-based monomer is selected from the group consisting of styrene, 4-chloro-α-methylstyrene, α-methylstyrene, 4-methylstyrene, α-ethylstyrene, 4-ethylstyrene, 3-methylstyrene, 4-propylstyrene, 4-cyclohexylstyrene, divinylbenzene, 3-methoxy-α-nitrostyrene, nitrostyrene, fluorostyrene, bromostyrene, chlorostyrene, chloromethylstyrene, aminostyrene, 4-methoxystyrene, 4-ethoxystyrene, hydroxystyrene, acetoxystyrene, 1-vinylnaphthalene, 2-vinylnaphthalene, 4-dodecylstyrene, 2-ethyl-4-benzylstyrene, 4-(phenylbutyl)styrene and combinations thereof.

3. The etch-resistant composition of claim 1, wherein the (meth)acrylate-based monomer is selected from the group consisting of methyl acrylate, methyl methacrylate, ethyl acrylate, ethyl methacrylate, butyl acrylate, butyl methacrylate, isobutyl acrylate, isobutyl methacrylate, 2-phenoxyethyl acrylate, 2-(2-ethoxyethoxy)ethyl acrylate, cyclic trimethylolpropane formal acrylate, isooctyl acrylate, isooctyl methacrylate, isodecyl acrylate, 2-ethylhexylacrylate, ethoxylated 1,6-hexanediol diacrylate, dipropylene glycol diacrylate, ethoxylated dipropylene glycol diacrylate, neopentyl glycol diacrylate, propoxylated neopentyl glycol diacrylate, 2-methyl-1,3-propylene glycol diacrylate, ethoxylated 2-methyl- 1,3-propylene glycol diacrylate, 2-butyl-2-ethyl-1,3-propylene glycol diacrylate, ethylene glycol dimethacrylate, diethylene glycol dimethacrylate, tri(2-hydroxyethyl)isocyanurate triacrylate, propoxylated trimethylolpropane triacrylate, trimethylolpropane trimethacrylate, pentaerythritol tetraacrylate, ethoxylated pentaerythritol tetraacrylate, ditrimethylolpropane tetraacrylate, propoxylated pentaerythritol tetraacrylate, dipentaerythritol hexaacrylate, tripropylene glycol di(meth)acrylate, 1,4-butanediol di(meth)acrylate, 1,6-hexanediol di(meth)acrylate, ethoxylated trimethylolpropane tri(meth)acrylate, propoxylated glycerol tri(meth)acrylate, triethylene glycol dimethacrylate, trimethylolpropane tri(meth)acrylate, and combinations thereof.

4. The etch-resistant composition of claim 1, wherein the first organic solvent is selected from the group consisting of toluene, 2,2,4-trimethyl-1,3-pentanediol monoisobutyrate, 2,2,4-trimethyl-1,3-pentanediol diisobutyrate, propylene glycol monomethyl ether acetate, methyl ethyl ketone, methyl n-pentyl ketone, cyclohexanone, N,N-dimethylethylamine, N-methylpyrrolidone, 1,3-cyclohexyldimethylamine, poly(maleic acid), butyl carbitol acetate, diethylene glycol ethyl ether acetate, diethylene glycol, ethylene glycol butyl ether acetate, 2,4-dimethyl-3-pentanone, cyclohexane, dimethyl glutarate, dimethyl succinate, dimethyl adipate, butyl acetate, terpineol, ethylene glycol phenyl ether, diethylene glycol monobutyl ether, dimethyl nylon acid and combinations thereof.

5. The etch-resistant composition of claim 1, which further comprises a thixotropic agent.

6. The etch-resistant composition of claim 5, wherein the thixotropic agent is selected from the group consisting of inorganic silicates, silica, organic bentonite, asbestos, kaolinite, attapulgite, calcium carbonate, emulsified polyvinyl chloride, amide wax, polyethylene wax, sorbitol, vegetable oil-based polymers, polyurethanes, metallic soaps, and combinations thereof.

7. The etch-resistant composition of claim 5, wherein the amount of the thixotropic agent is about 0.1 wt. % to about 5.0 wt. % on the basis of the total weight of the etch-resistant composition.

8. The etch-resistant composition of claim 1, which further comprises an adhesion promoter having a molecular weight of less than 100,000.

9. The etch-resistant composition of claim 8, wherein the adhesion promoter is selected from the group consisting of silane coupling agents, phosphate esters, titanate esters, zirconate esters, chlorinated polyolefins, and combinations thereof.

10. The etch-resistant composition of claim 8, wherein the amount of the adhesion promoter is about 1.0 wt. % to about 5.0 wt. % on the basis of the total weight of the etch-resistant composition.

* * * * *